United States Patent [19]
Davidov et al.

[11] Patent Number: 5,781,018
[45] Date of Patent: Jul. 14, 1998

[54] NEAR-FIELD RESISTIVITY MICROSCOPE

[75] Inventors: Dan Davidov, Jerusalem; Michael Golosovsky, Ma'ale Adumin, both of Israel

[73] Assignee: Yissum Research Development Company of the Hebrew University of Jerusalem, Israel

[21] Appl. No.: 898,804

[22] Filed: Jul. 23, 1997

Related U.S. Application Data

[63] Continuation of Ser. No. 526,659, Sep. 11, 1995, abandoned.

[51] Int. Cl.$^6$ ................................................. G01N 22/00
[52] U.S. Cl. .......................... 324/637; 324/639; 324/642
[58] Field of Search ................................. 324/501, 513, 324/534, 752, 754, 637, 638, 639, 641, 642, 644, 646; 333/239, 241, 242, 252, 248; 374/122, 128

[56] References Cited

U.S. PATENT DOCUMENTS

| | | | |
|---|---|---|---|
| 2,407,068 | 9/1946 | Fiske et al. | 333/253 X |
| 3,102,232 | 8/1963 | Leonard et al. | 324/644 |
| 3,144,601 | 8/1964 | Slabodsky | 324/639 X |
| 4,492,915 | 1/1985 | Caspers | 324/637 X |
| 4,994,818 | 2/1991 | Keilman | 343/786 |
| 5,081,414 | 1/1992 | Kusama et al. | 324/642 X |
| 5,103,182 | 4/1992 | Moslehi | 324/637 X |

OTHER PUBLICATIONS

Dahm et al., "ESR imaging study of the spin distribution in ladder-type polymer films containing spatially selective conducting patterns," *Polymers for Advanced Technologies*, vol. 1, pp. 247–252, 1990.

Wang et al., "High spatial resolution dielectric constant uniformity measurements . . . ," *IEEE MTT–S International Microwave Symposium*, 8–10 May 1990, Dallas, Texas, Digest, vol. 3, pp. 1121–1124.

Ash et al., Super–resolution Aperture Scanning Microscope. *Nature*, vol. 237, pp. 510–512, 1972.

Bryant et al., "Noncontact Technique for the Local Measurement of Semiconductor Resistivity," *Review of Scientific Instruments*, vol. 36, pp. 1614–1617, 1965.

Merz et al., *Physical Review Letters*, vol. 70, 1993, pp. 651–653.

Tabib–Azar et al., "Nondestructive characterization of materials by evanescent microwaves," *Measurement Science Technology*, vol. 4, pp. 583–590, 1993.

Druon et al., "Novel microwave device for nondestructive electrical characterization of semiconducting layers," *Review of Scientific Instruments*, vol. 61, 3431–3434, 1990.

Moreno, *Microwave transmission design data* (Dover, New York, 1958), p. 158.

*Primary Examiner*—Michael Brock
*Attorney, Agent, or Firm*—Charles S. Guenzer

[57] ABSTRACT

A microwave microscope comprising a microwave waveguide having a probe end positioned closely above the surface to be probed such that the surface is in the near field of the microwave radiation. The end of the probe facing the surface is covered with a metallic foil or a conducting film deposited over a dielectric layer and having a rectangular slit formed therein. The long dimension of the slit is nearly resonant with the microwave, that is, just slightly longer than one-half the microwave wavelength. The short dimension is substantially shorter than long dimension and is chosen such that the slitted end is transparent to the microwave. Thereby, substantial microwave power is emitted through the slit with fine resolution that is determined by the short dimension of the slit. The probe is scanned across the surface in the direction of the short slit dimension, and its resolution is approximately equal to the short slit dimension. Preferably, the end is convexly curved along the direction of the long slit dimension so that only a portion of the slit is in the near field, thereby reducing the effective lateral dimension.

31 Claims, 4 Drawing Sheets

NEAR-FIELD RESISTIVITY MICROSCOPE

This is a continuation of application of Ser. No. 08/526,659 filed on Sep. 11, 1995, now abandoned.

FIELD OF THE INVENTION

The invention generally relates to electrical measuring equipment and methods. In particular, the invention relates to microwave equipment and methods for mapping resistivity and other electrical characteristics over a surface with resolution of a few micrometers, that is, a microwave microscope.

BACKGROUND OF THE INVENTION

It is often desired to map electrical resistivity over a surface and to do so with fine resolution. In particular, the microelectronics industry requires that the uniformity of electrical properties of semiconducting wafers of silicon, gallium arsenide, and other semiconductors and of conducting polymers be tightly controlled in order to achieve acceptable yield of integrated circuit dies over a large wafer. It is common to map the resistivity of the wafers in order to monitor wafer uniformity both before processing and after ion implantation or layer growth.

Heretofore, resistivity mapping has been typically performed with a movable probe and point contacts mechanically pressed against the wafer to thereby map the DC resistivity using two-point or four-point probes. This method is limited to resolution in the neighborhood of 50 to 100 µm, and the method further suffers from the direct mechanical contact between the probe and wafer, which presents the danger of damaging the wafer or probe.

Several contactless methods have been developed to avoid the damage problem. In eddy-current testing, a miniature coil is scanned at a fixed height above the surface, and the coil is part of a sensitive inductive bridge. Variations of resistivity in the surface underlying the coil unbalance the bridge, and the bridge output thus maps the resistivity. Although the method is quite powerful, its resolution is limited to dimensions of the order of 1 mm, the minimum size of the coil. Yet smaller coils suffer from significantly decreased inductance.

Several methods can map resistivity with nanometer resolution. One example is a capacitance microscope in which a sharp needle is scanned over the conducting surface, and the capacitance between the needle and the surface is measured. The capacitance disappears for a non-conducting surface. However, the capacitance microscope is insensitive to finer gradations of resistivity. Scanning tunneling microscopes can also map resistivity with nanometer resolution, but they have not been applied to the large-sized areas desired for wafer inspection.

Several microwave methods have been used to map resistivity. These methods rely on the fact that the reflection or transmission of electromagnetic waves at a conducting surface is determined by the resistivity ($\rho=1/\sigma$) and dielectric constant $\epsilon$ of the surface material, which can be combined into a complex conductivity ($\sigma - i\epsilon\omega/4\pi$). Therefore, a microwave beam is scanned across the surface, and the intensity of the reflected or transmitted microwave radiation is measured, to thereby provide a resistivity map. Most of these methods focus the microwave beam on a small spot and collect the reflected or transmitted beam with a horn antenna. That is, these are far-field techniques whose resolutions are limited to about the wavelength of radiation, that is, of the order of 1 mm at 94 GHz. Microwave components are not generally available above this frequency. Also, electrical characteristics in the sub-millimeter range may bear little relationship to the electrical characteristics at much lower frequencies or DC. Other techniques use an open waveguide or a parallel-plate antenna, which are actually near-field probes but do not have high spatial resolution.

Nonetheless, microwave measurement techniques have achieved much finer resolution using the methods of near-field microscopy. Ash et al. disclosed near-field microwave microscopy in "Super-resolution Aperture Scanning Microscope," *Nature*, vol. 237, pp. 510–512, 1972. They used an aperture of 1.5 mm diameter in a 10 GHz ($\lambda=3$ cm) microwave guide to achieve a spatial resolution of $\lambda/60$. They argued that a similar arrangement with 8 mm microwaves and very small apertures would enable resolution of tens of microns. We believe that further improvements in resolution beyond those reported using this design are not practical. Very small apertures transmit very little power since they are below cut-off. Transmitted power through a very small aperture may be increased if this aperture is included within a high-Q resonator; however, a resonator severely limits bandwidth and is inappropriate for time-domain studies, which are important for measuring local lifetimes. The lifetime is determined from the change of conductivity upon illumination by a short laser pulse. A resonator, which has an inherently slow time response, is not good for monitoring short time responses.

A coaxial cable may be used to probe a surface in the near field, as has been disclosed by Bryant et al. in "Noncontact Technique for the Local Measurement of Semiconductor Resistivity," *Review of Scientific Instruments*, vol. 36, pp. 1614–1617, 1965. Recently, this technique has been extended to smaller resolutions with miniature coaxial cable. A microstrip resonator with a small antenna can be scanned over the surface, as has been described by Keilman in U.S. Pat. No. 4,994,818. Merz et al. provide a similar disclosure in *Physical Review Letters*, vol. 40, 1993, pp. 651–653. The antenna couples either inductively or capacitively to the underlying surface. This technique has been described by Tabib-Azar et al., "Nondestructive characterization of materials by evanescent microwaves," *Measurement Science Technology*, vol.4, pp. 583–590, 1993. A scanned microstrip resonator can be used to map mobility with a resolution of several millimeters, as has been disclosed by Druon et al., "Novel microwave device for nondestructive electrical characterization of semiconducting layers," *Review of Scientific Instruments*, vol. 61, 3431–3434, 1990.

SUMMARY OF THE INVENTION

Accordingly, an object of the invention is to provide apparatus and method for mapping resistivity of a surface with resolution in the range of 10 µm to several centimeters.

A further object of the invention is to provide a contactless method of mapping electrical characteristics of a surface.

The invention can be summarized as a near-field microwave microscope and its method of use in which a rectangular or other microwave waveguide includes a resonant slit aperture having a long dimension that is resonant with the microwaves and also having a short dimension that is substantially smaller and which determines the resolution. The slit aperture is scanned over the surface, and the microwave radiation is measured either in reflection or transmission to map an electrical parameter of the material, in particular, the electrical resistivity.

DETAILED DESCRIPTIONS OF THE PREFERRED EMBODIMENT

Figure 1:
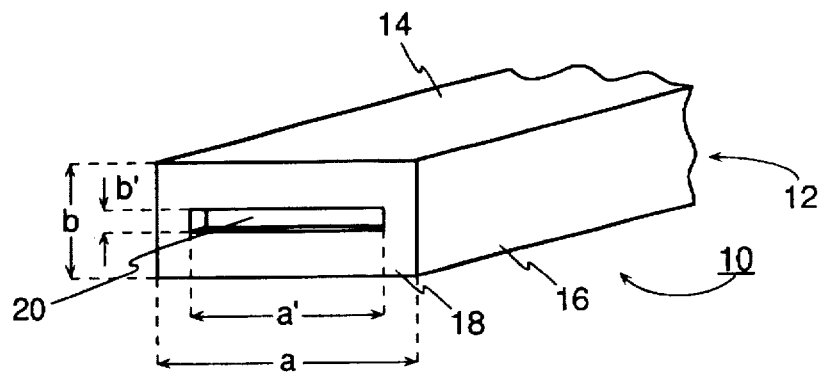
FIG. 1 is a perspective view of a microwave waveguide and a resonant slit which form one embodiment of a probe of the invention.

A first embodiment of the invention relies upon a microwave probe 10 illustrated in perspective in FIG. 1. A rectangular microwave waveguide includes two side walls 14 of width a and two narrow side walls 16 of width b, all of which are highly conductive so as to support microwaves within the rectangular cavity defined by the side walls 14 and 16. The wall dimensions are chosen to support microwaves within a predetermined frequency or wavelength band. For a given microwave wavelength $\lambda_0$, there is set of minimum dimensions lower than which the microwave radiation is not supported by the waveguide, and, as a result, the radiation quickly attenuates within the waveguide. There are no maximum dimensions, but the microwave radiation propagates with excessive loss when the waveguide size is substantially larger than the microwave wavelength. It is, however, emphasized that a circular or other cross-sectional waveguide will also propagate microwaves and thus be usable with the invention.

A conductive foil end wall 18 is joined to the waveguide 12 at its probe end and includes a centrally located slit aperture 20 having a long dimension a' along the long waveguide side 14 and a short dimension b' along the short waveguide side 16. Instead of the conductive foil, a fairly thick dielectric wall 18 can be used on which is coated a thin conductive coating. The conductive coating may be deposited on either the inside or the outside of the dielectric wall, and the aperture 20 may be formed in the conductive coating by chemical etching or laser ablation.

Assume for now that the waveguide interior is not dielectrically loaded so that the microwave wavelength $\lambda$ is the free-space value $$\lambda_0 = \frac{c}{f}, \quad (1)$$

where c is the speed of light in free space and f is the microwave frequency. The slit length a' is chosen to be approximately half the free-space wavelength $\lambda_0$. The reflection and transmission of electromagnetic waves through such a slit 20 is related to the slit's impedance $Z_s$, which is given approximately by $$Z_S = Z_0 \frac{\pi b'}{2a'} \frac{1}{\sqrt{1 - \left(\frac{\lambda_0}{2a'}\right)^2}}, \quad (2)$$

where $Z_0$ is the impedance of free space, which is 377Ω. This equation shows that there is a cut-off wavelength $$\lambda_c = 2a', \quad (3)$$

above which the radiation cannot penetrate the slit 20. Equation (2) should be considered to only approximately apply to the propagation of electromagnetic radiation in the invention, but it illustrates important limits of the operation of the invention.

Near cut-off, even for arbitrarily small slit widths b', the slit impedance $Z_s$ can be made equal to the free-space impedance $Z_0$ so as to guarantee high transmission.

It is further known that for a slit aperture separating two portions of waveguide, if the dimensions of the slit and waveguide are such as to satisfy the condition $$\frac{a}{b} \sqrt{1 - \left(\frac{\lambda}{2a}\right)^2} = \frac{a'}{b'} \sqrt{1 - \left(\frac{\lambda}{2a'}\right)^2}, \quad (4)$$

then the slit 20 and end plate 18 are transparent at this wavelength $\lambda$. This condition has been described by Moreno in *Microwave transmission design data* (Dover, N.Y., 1958), p. 158. Equation (4) demonstrates that as a' approaches 2$\lambda$ from above, that is, approaches cutoff, the slit's narrow dimension b' can be made very small to the limit of a few micrometers. The minimum size of the slit is limited by the skin depth, approximately 0.2 μm in copper at 100 GHz. Therefore, even a very narrow slit is transparent at microwave wavelengths just below $\lambda_c$. Although the transparency of Equation (4) strictly applies to an apertured barrier rather than for the slot-antenna of FIG. 1, we expect that such transparency is available for slot antennas.

The length a' of the slit 20 is constrained to be near $\lambda/2$, which at 100 GHz is 1.5 mm. This length in the embodiment of the probe of FIG. 1 substantially determines the lateral resolution. However, the lateral resolution can be improved in the microwave probe 30 illustrated in perspective in FIG. 2 and in perpendicular lateral cross-sections in FIGS. 3 and 4. The probe end of the waveguide 12 is convexly curved, and a thin conductive foil 32 is attached to the curved end such that its slit 34 is also curved in its long direction. As shown in the cross section of FIG. 5, a low-loss dielectric body 35 placed in the end of the probe supports the thin foil 32 on a curved front surface, and its triangularly shaped rear side minimizes microwave reflection.

Figure 3:
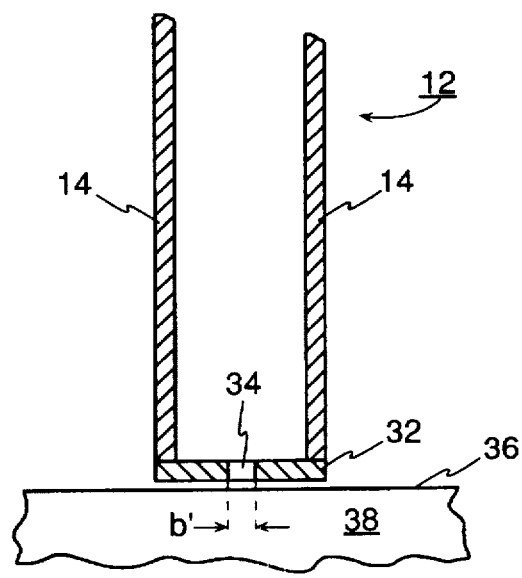
FIGS. 3 and 4 are cross-sectional view of the probe of FIG. 2 taken along respective sectional lines 3—3 and 4—4.
Figure 4:
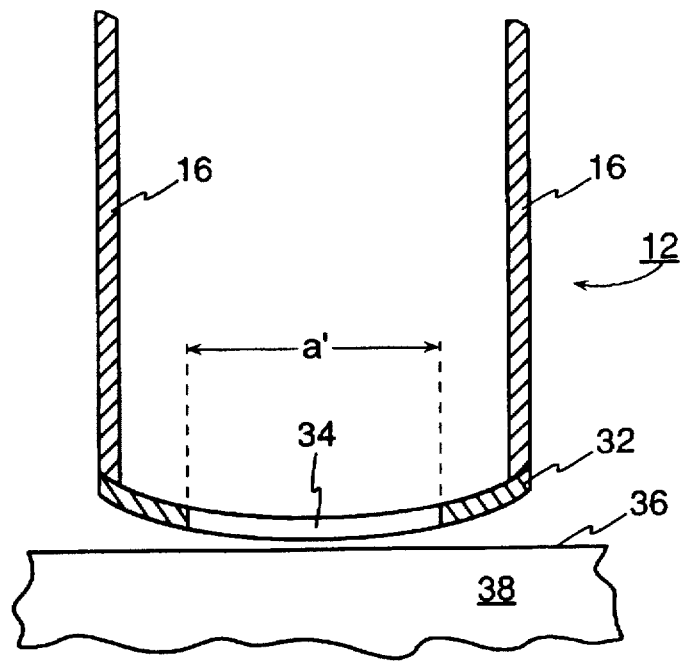
Figure 5:
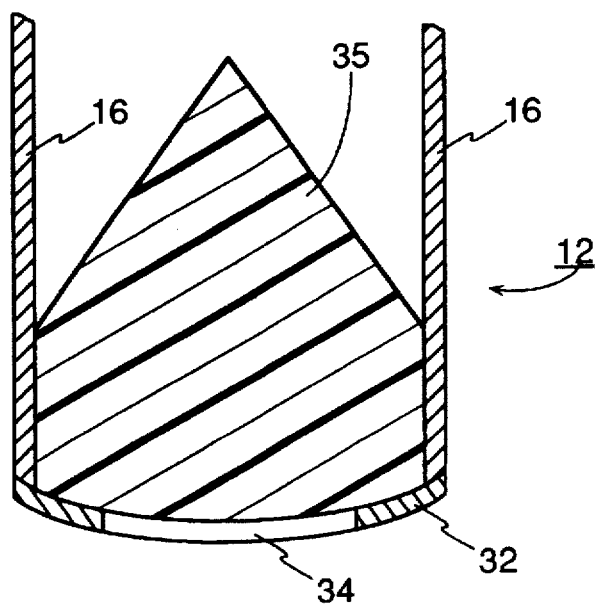
FIG. 5 is a cross-section view corresponding to FIG. 3 and showing an additional element.

As illustrated in FIG. 4, the probe 12 is then scanned in the short dimension of the slit 20 at a fixed small distance above the surface 36 of a material being electrically characterized. The small resolution is closely related to the slit width b' as illustrated in FIG. 3. The larger resolution is less than the slit width a' because the curvature of the end foil 32 puts only a smaller central portion of the slit near the probed surface 36. The side portions of the slit 34 are too far away to conform with the requirements of the surface 36 being within the near field of the slit 34. The tip of the probe is typically kept at a constant height above the probed surface of a few micrometers so as to maintain the probed surface within the near field.

If the resonant slit is placed very close to a conducting surface, the reflection or transmission coefficient, depending upon the mode of operation, depends strongly on the resistivity in the small region under the probe. Measuring the amplitude and phase of the reflected or transmitted wave while scanning the surface yields a one-dimensional profile of the resistivity in the microwave range. Scanning along different directions and using deconvolution techniques yield a two-dimensional map of the resistivity. Such deconvolution techniques are described by Dahm et al. in "ESA imaging study of the spin distribution in ladder-type polymer films containing spatially selective conducting patterns," *Polymers for Advanced Technologies*, vol. 1, pp. 247–252, 1990. If the thickness of the scanned surface is known, both the resistivity and dielectric constant can be mapped to thereby provide coherent imaging of a surface. Such imaging is accomplished by simultaneously measuring both amplitude and phase of the reflected or transmitted microwave radiation relative to the incident microwave radiation as the sample is scanned past the microwave microscope.

The resolution of the microscope in the direction perpendicular to the slit is determined by the width of the slit and by the skin depth of the material in which the slit is cut. The slit may formed in a metallic layer deposited of a metal material, such as aluminum, to a thickness of about 1 µm, and then subsequently defined by chemical lithography or laser definition. Alternatively, the slit can be cut in aluminum, copper, or nickel foil having a thickness of 10 to 20 µm. A 10 µm-wide and 1 to 2 mm-long slit can be formed by electroforming or cutting with a Nd-YAG laser. Narrower slits can be formed, but there is no need for a slit of less than 1 µm because the skin depth of copper is 0.2 µm at 100 GHz. Thus, the ultimate resolution for scanning in a direction perpendicular to the slit is on the order of a few micrometers at 100 GHz.

The resolution for scanning a direction parallel to the slit is determined by the field pattern in the slit and by the curvature of the probe tip. We expect this resolution, without deconvolution, to be less than 1 mm.

The range of conductivities that may be probed is determined by the fact that the sensitivity to variations of the conductivity at a given frequency is highest when the size of the probe is of the same order of magnitude as the skin depth of the tested material. Hence, the optimal range for millimeter waves lies within $10^{-2}$ to $10^{+2} \Omega^{-1}$ cm$^{-1}$. This range is of great interest for semiconducting wafers and conducting polymers.

Figure 2:
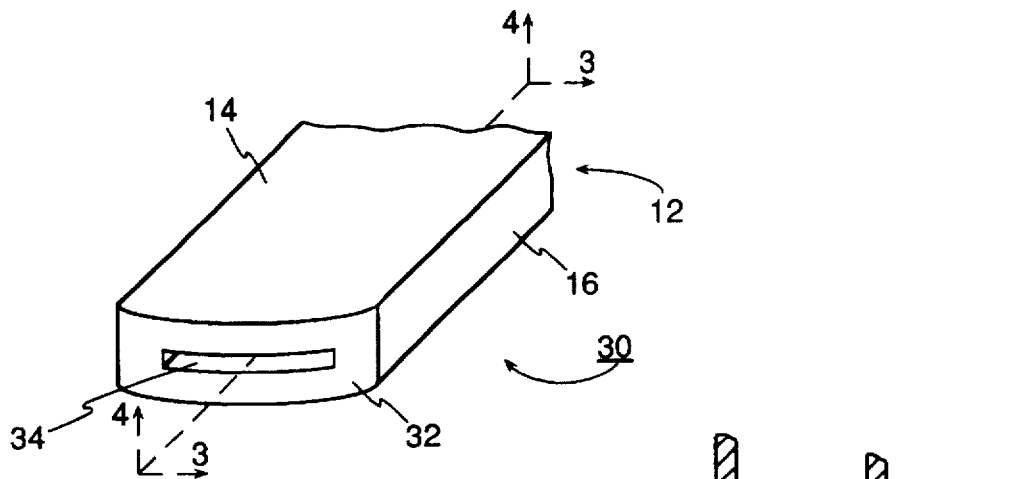
FIG. 2 is a perspective view of another embodiment of a probe utilizing a curved slit.
Figure 6:
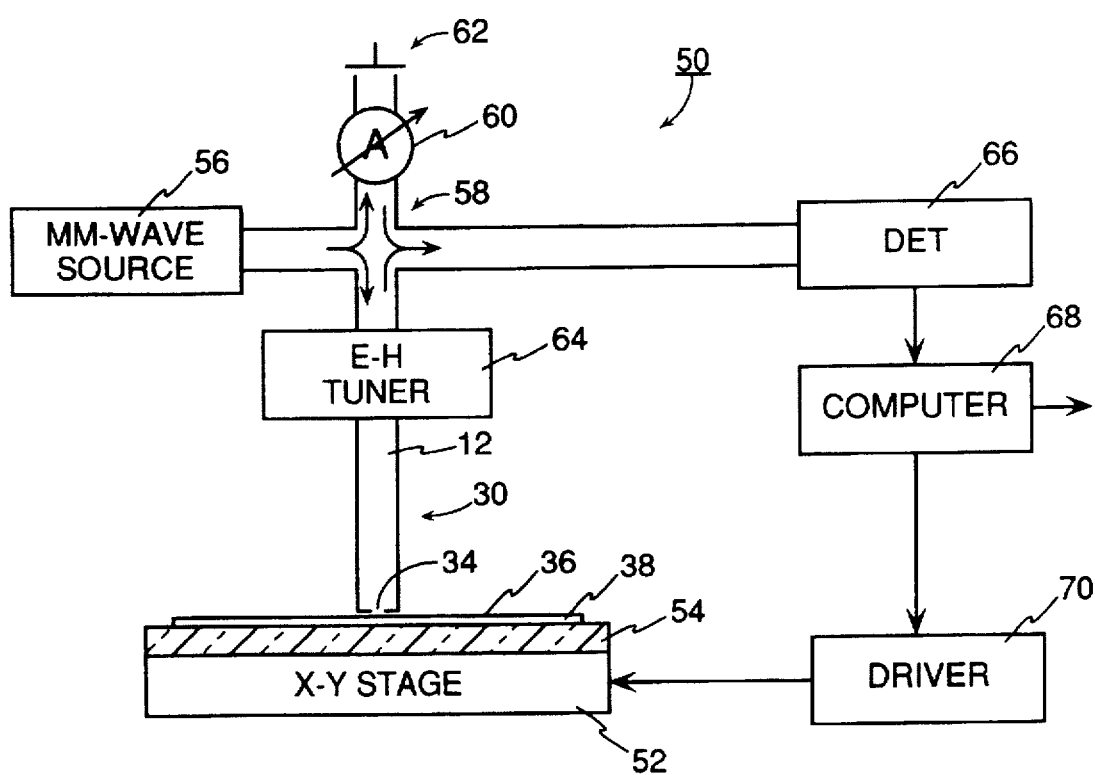
FIGS. 6 and 7 are schematic illustrations of two embodiments of the microscope of the invention using different electronics.

A working embodiment of a microwave microscope 50 of the invention, schematically illustrated in FIG. 6, uses the curved probe 30 of FIGS. 2–4 and works in the reflection mode. The slit is cut into 20 µm-thick aluminum foil, has dimensions of 1.5 mm by 100 µm, and transmits at 80 GHz. The tested material 38, for example, a semiconductor wafer, is mounted on a movable X-Y stage 52 through an intermediate thick glass plate 54.

A source of millimeter wave microwave radiation 56, for example, an HP 83558A microwave generator, provides the probing microwaves. An E-band millimeter-wave bridge is formed of a hybrid tee 58, an adjustable attenuator 60, a sliding short 62, and an E-H tuner that matches the impedance of the slit antenna to that of the waveguide. A microwave detector 66 receives radiation from the bridge to thereby measure its imbalance, and the intensity is transmitted to a computer 68, which is also controlling a driver 70 scanning the X-Y stage 52 in a 2-dimensional scan. The detector may be a Millitech DXP-12 crystal detector. To increase sensitivity, a signal generator modulates the amplitude of the millimeter-wave source 56 and serves as a synchronizing signal for a lock-in amplifier, such as a SR830-DSP, receiving the output of the detector 66. The sensitivity can be further increased and phase may be measured by shifting the operating point of the detector 66 by varying the attenuator 60 and the sliding short 62.

The computer 68 outputs the detector signal registered with the X-Y position of the wafer 38. If the bias signal is in phase with the reflected signal, the detector voltage is sensitive to variations of the amplitude of the reflected signal, but, if the bias signal is in quadrature with the reflected signal, then the detector voltage is sensitive to phase variations. The amplitude gives information about the resistivity while the phase yields information about the dielectric constant. Tabib-Azar et al., ibid., give a more complete discussion of measuring both parameters.

In operation, first, the slit is directed to open space, the attenuator 60 is put to maximum attenuation, and the E-H tuner is varied to balance the bridge in order to match the impedance of the slit. Then, the sample 38 is mounted onto the X-Y stage while the stage 54 moves the sample 38 beneath the probe 30 with a constant separation of a few micrometers.

This setup was used at 80 GHz to image a section of a test pattern by scanning the probe across the test pattern. No deconvolution was used. As expected, the best resolution was obtained in the direction of the short dimension of the slit. The best imaging of a 2-dimensional pattern was obtained by scanning in a direction non-orthogonal to principal perpendicular features. The experiment showed that a 100 µm-wide probe well resolves five line pairs per millimeter (line widths of 100 µm) and reasonably resolves eight line pairs per millimeter (line widths of 70 µm). Therefore, the spatial resolution of the microscope is determined by the slit width and not by the wavelength.

Figure 7:
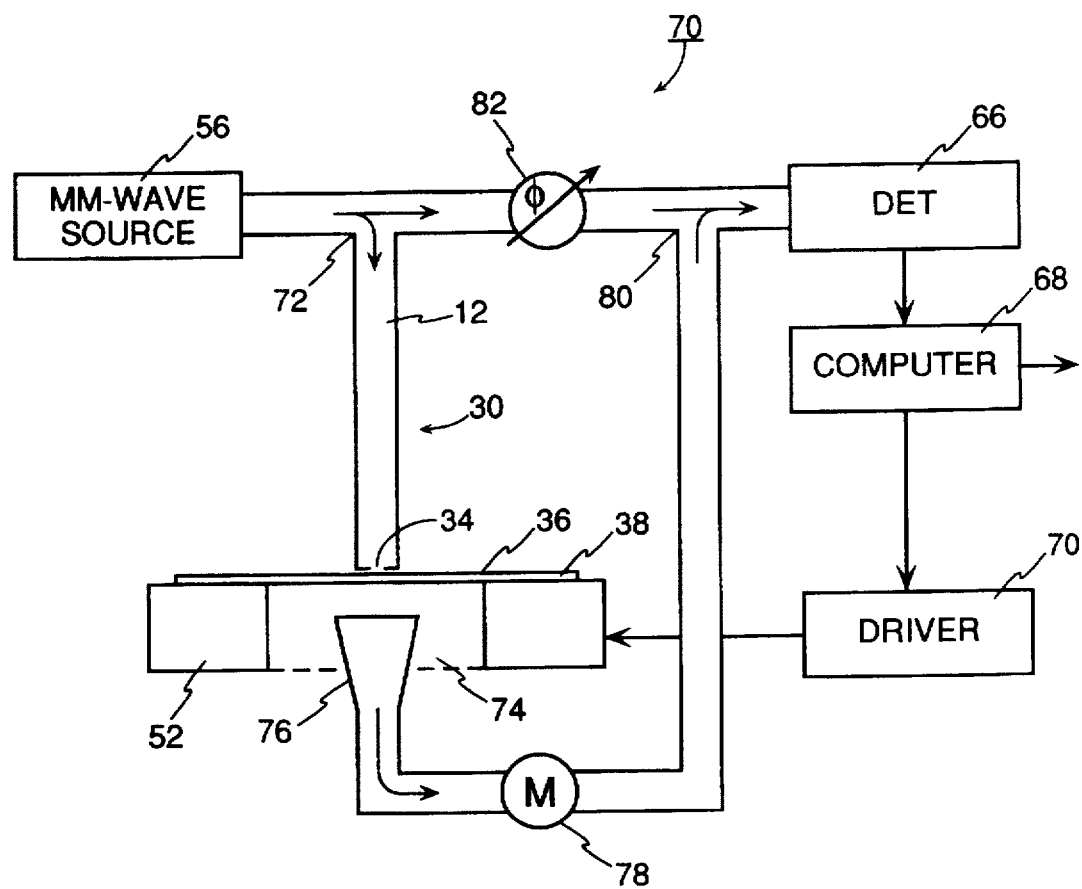

The embodiment of FIG. 6 operated in the reflection mode. A microwave microscope 70 of the invention operating in the transmission mode is schematically illustrated in FIG. 7. The radiation from the millimeter-wave source 56 is split at a first tee 72 into coherent radiation for a test signal and for a reference signal. The test signal is delivered through the probe 30 to the sample 38, which is cantilevered over a central aperture 72 of the X-Y stage 52. The slit 34 of the probe is positioned a few micrometers over the sample 38, and the sample 38 is relatively thin in order to satisfy the near-field conditions. However, it is pointed out that, if the sample is thick but any variations occur relatively close to the surface, the surface area will give the greatest contrast while the bulk will produce a much smoother background.

A horn antenna 76 receives microwave radiation transmitted through the sample 38. Preferably, this transmitted portion is modulated by a modulator 78 before it is recombined with the reference signal in a second tee 80. A phase shifter 82 may be used to phase shift the reference signal either to maximize the signal or to provide a complex dielectric constant of the sample 38. The detector 66 detects the combined signals, preferably as phase locked with the modulator 78, and its output is compared by the computer 68 with the X-Y position of the sample 38 controlled by the driver 70 to thereby provide an X-Y map of the electrical parameters of the sample 38. If the sample is relatively thin, the near-field condition is satisfied throughout the sample. However, a relatively transparent sample can be thicker. The surface inhomogeneities are well focused while the underlying portions, which are in the far field, produce a smooth background.

A somewhat similar embodiment is possible in the reflection mode if the first tee 72 is replaced by a circulator an two tees pass a reference signal, possibly as adjusted by a phase shifter, around the circulator. There are other microwave circuits that can be used to measure the amplitude or phase of signals in either the reflection or transmission mode. The embodiments of FIGS. 6 and 7 are intended to demonstrate the variety of measuring circuits and not, in any way, to limit what circuits can be used with the invention.

Although the embodiments described above use a rectangular waveguide, the invention can be implemented using a circular waveguide with a resonant rectangular slit at its end.

The invention can be applied to a number of advantageous uses.

As mentioned before, the microwave microscope can be advantageously applied to testing conducting polymer films. In these films, high conductivity is usually achieved by doping, which unfortunately leads to inhomogeneities in the conductivity. The inventive microwave microscope provides the abilities to study dopant diffusion and doping mechanisms.

Previously, photoresistivity (that is, the inverse of photoconductivity) was measured using local illumination using an optical fiber and non-local microwave measurement. With the invention, the sample can be locally or broadly illuminated with optical radiation and locally probed with millimeter waves.

Thermal-wave imaging is a well established technique. A laser beam is amplitude-modulated and locally heats a surface while a second beam probes the reflectivity in a nearby spot. Measuring the amplitude and phase of the reflected beam yields information about thermal conductivity, depth, and absorption coefficient of the substrate. The present invention allows either very localized heating of the substrate with millimeter waves or micrometer-sized probing of the resultant heating. Further, the microwave probe yields somewhat different information from the optical-wavelength thermal probing commonly used. Further, the microwave probe frequency may be tuned to some particular absorption transition so as to map a local chemical distribution.

The invention can be advantageously used to check electronic circuits, for example, to test the quality of soldering and uniformity of leads. The invention provides advantages over previous contact methods in that the resistivity may be measured in a final product through a protective polymer coating since the polymer coating has significantly different microwave properties from the underlying circuit and generally less affects the microwaves.

Similarly, the microwave microscope of the invention can be advantageously applied to characterizing buried interfaces, particularly conductive layers or patterns coated by more electrically insulative layers, especially protective layers. Although the thickness of the overlayer is not fundamentally limited, a thick overlayer will degrade the spatial resolution as the interface falls more into the far field of the microwave radiation. A thickness of several micrometers of an insulative overlayer should allow adequate resolution of the conductive underlayer or interface. In more general terms, the overlayer thickness should be limited to not substantially more than $\lambda/10$ to retain the underlayer in the near field, where $\lambda$ is the free-space microwave wavelength $\lambda_0$ reduced to account for the dielectric constant of the overlayer.

Biological specimens can be advantageously imaged using the invention because the microwave radiation affords a greater contrast than does the more typical optical radiation. In the optical bandwidth, most materials have an refractive index in the range of 1 to 3. However, in the microwave bandwidth, the refractive index is typically equal to the DC value and so varies within the wider range of 1 to 10 (and even higher). In particular, the refractive index of water in the millimeter-wave range is very high, 3 to 9 depending on the frequency, and it differs considerably from other dielectrics, which typically have refractive indices in the range of 1 to 2. Thus, the invention allows high-contrast imaging of biological specimens and other objects containing water. Moreover, since the index of refraction of water in the RF band is strongly dependent on its salt concentration, the invention provides a method of measuring and mapping local salt concentration.

The invention is particularly advantageous in imaging the local transition between liquid water and ice because the RF contrast between water and ice is much greater than is the optical contrast.

The invention allows very localized radiometry of measuring the black-body radiation, that is, the temperature, of surfaces. A simple type of radiometry does not require a source of microwave radiation. Instead, a passive microwave probe and detector are scanned over the sample surface. The sample itself provides the microwave radiation in the microwave portion of the distribution of its blackbody radiation. Any variations in the local temperature, thermal emissivity, or other localized excitation are measurable with resolutions associated with the microwave probe of the invention.

Heretofore, thermal imaging was performed in the far field. With the invention, a probe can scan the surface in the near field and provide much improved resolution of the temperature distribution at the surface of the sample, for example, hot spots in an integrated circuit.

The invention can be improved in a number of ways.

We have observed that a simply convexly curved probe end can improve the resolution by a factor of three. Other convex shapes can be used with the invention and may provide yet better resolution.

The waveguide may be filled with a dielectric. The refractive indices of many materials in the microwave and millimeter range are very high, $n \approx 3$–10, in contrast to the optical wave band, in which $n \approx 1$–2. Thus, it is possible to dielectrically fill a W-band waveguide having dimension of 0.35 mm×0.15 mm to support microwaves in the band of 75–110 GHz. Such a waveguide can be prepared by coating a dielectric of the appropriate dimensions. Dielectrically loading the entire probe waveguide allows a waveguide of small dimensions to be used with microwaves having relatively long free-space wavelengths. The smaller waveguide allows finer resolution.

The invention may be used to combine a bright source of microwaves with an optical source and to measure an interaction between the microwave and optical radiation. The inventive intense microwave source replaces thermal imaging systems reliant upon optics. Presently, such techniques include local high-intensity imaging of semiconductors at a sufficient level to excite electron-hole pairs, which then diffuse from the illuminated spot. Another application probes the reflectivity of a neighboring spot to determine the intermediate diffusivity.

What is claimed is:

1. A microwave microscope for characterizing a surface, comprising:

a source of electromagnetic radiation;

a microwave waveguide receiving said electromagnetic radiation from said source on a first end; and an aperture formed into said microwave waveguide and having a first dimension extending along a first direction of said waveguide and being nearly resonant with said electromagnetic radiation and having a second dimension extending along a second direction different from said first direction and being substantially smaller than said first dimension;

wherein a surface to be tested by said microscope is positioned adjacent to said aperture by a distance substantially less than said first dimension so as to be in a near field of said microwave radiation emanating from said aperture.

2. The microwave microscope of claim 1, further comprising a stage on which said surface is mounted an which is movable relative to said waveguide.

3. The microwave microscope of claim 2, wherein said stage is movable in two dimensions in a plane perpendicular to a propagation direction of said waveguide.

4. The microwave microscope of claim 1, further comprising a radiation detector for detecting electromagnetic radiation emitted through said aperture and interacting with said surface.

5. The microwave microscope of claim 4, wherein said radiation detector is electromagnetically coupled to said microwave waveguide, whereby said microwave microscope is operating in a reflection mode.

6. The microwave microscope of claim 4, wherein said radiation detector is disposed on an opposite side of said surface from said aperture, whereby said microscope is operating in a transmission mode.

7. The microwave microscope of claim 4, wherein said radiation detector additionally detects a phase of said detected radiation relative to said emitted radiation.

8. The microwave microscope of claim 1, wherein an end of said microwave waveguide facing said surface is curved along said first direction.

9. The microwave microscope of claim 1, wherein said aperture is substantially rectangular.

10. The microwave microscope of claim 9, wherein an end of said microwave waveguide facing said surface is curved along said first direction.

11. A microwave probe, comprising:
a microwave waveguide; and
a metallic end placed on said waveguide having an aperture formed therein with a first dimension extending along a first direction of said waveguide and being nearly resonant with electromagnetic radiation carried by said waveguide and a second dimension extending along a second direction of said waveguide different from said first direction and being substantially smaller than said first dimension, wherein said end is convexly curved along said first direction.

12. The microwave probe of claim 11, further comprising a source generating electromagnetic waves in said waveguide of wavelength $\lambda$, and wherein said first dimension is closer to $\lambda/2$ than $\lambda$.

13. The microwave probe of claim 12, wherein said microwave waveguide is a rectangular waveguide having a short dimension a and a long dimension b, wherein said first dimension of said aperture is a' and said second dimension of said aperture is b', and wherein the following condition is approximately satisfied:

$$\frac{a}{b} \sqrt{1-\left(\frac{\lambda}{2a}\right)^2} = \frac{a'}{b'} \sqrt{1-\left(\frac{\lambda}{2a'}\right)^2}.$$

14. The microwave probe of claim 11, wherein said aperture is rectangular.

15. A method of scanning a surface for its electrical characteristics, comprising the steps of:
positioning a metallic end of a microwave probe at a height above said surface to be characterized, said microwave probe comprising a microwave waveguide being terminated in said metallic end and said metallic end having an aperture formed therein having a long dimension extending along a first direction of said waveguide and being substantially longer than said height and a short dimension extending along a second direction of said waveguide different from said first direction and being substantially shorter than said long dimension; and
scanning said microwave probe over said surface.

16. The method of claim 15, further comprising measuring an intensity of electromagnetic radiation emitted by said probe and interacting with said surface.

17. The method of claim 16, wherein said measuring step determines at least one of the parameters of resistivity, dielectric constant, and photoconductivity of said surface.

18. The method of claim 16, further comprising simultaneously measuring a phase of said electromagnetic radiation interacting with said surface relative to a phase of electromagnetic radiation impressed into said probe by a controlled electromagnetic wave generator.

19. The method of claim 15, wherein said end of said probe is convexly curved in said first direction.

20. The method of claim 15, further comprising impressing electromagnetic radiation into said waveguide.

21. The method of claim 20, wherein said long dimension is nearly resonant with said electromagnetic radiation.

22. The method of claim 21, further comprising choosing dimensions of said aperture to make said metallic end substantially transparent to electromagnetic radiation conveyed by said waveguide.

23. The method of claim 15, wherein said microwave probe receives electromagnetic radiation from said surface that is generated in a body including said surface, whereby said scanning step radiometrically scans said surface.

24. The method of claim 15, wherein said surface includes a insulative overlayer and an underlayer of substantially higher conductivity and wherein said positioning step positions said underlayer within a near field of said aperture of said microwave waveguide.

25. The method of claim 24, further comprising impressing electromagnetic radiation of wavelength $\lambda_0$ into said microwave waveguide and wherein said underlayer is displaced from said aperture by no more than $\lambda/10$ from said aperture, wherein $\lambda$ is a wavelength of said electromagnetic radiation in said overlayer.

26. The method of claim 15, wherein said aperture is substantially rectangular.

27. A microwave microscope, comprising:
a microwave waveguide capable of propagating electromagnetic energy along said waveguide; and
a conductive end wall disposed on a first end of said waveguide and having an aperture therethrough with two significantly different dimensions extending along respective different directions, wherein said first end of said waveguide is juxtaposable to a sample being tested by said microwave microscope by a distance less than a smaller one of said two dimensions.

28. The microwave microscope of claim 27, further comprising a source of said electromagnetic energy coupled to a second end of said microwave waveguide.

29. The microwave microscope of claim 27, further comprising a detector of said electromagnetic energy coupled to a second end of said microwave waveguide.

30. The microwave microscope of claim 27, further comprising scanning means for providing relative movement between said second end of said waveguide and an area of said sample.

31. The microwave microscope of claim 27, wherein a longer one of said dimensions is nearly resonant with said electromagnetic energy.

* * * * *